(12) United States Patent
Goodrich

(10) Patent No.: US 6,399,152 B1
(45) Date of Patent: Jun. 4, 2002

(54) VACUUM METALIZATION PROCESS FOR CHROMING SUBSTRATES

(75) Inventor: Gary D. Goodrich, Antioch, CA (US)

(73) Assignee: Goodrich Technology Corporation, Pittsburg, CA (US)

( * ) Notice: Subject to any disclaimer, the term of this patent is extended or adjusted under 35 U.S.C. 154(b) by 4 days.

(21) Appl. No.: 09/695,509

(22) Filed: Oct. 24, 2000

Related U.S. Application Data

(60) Provisional application No. 60/221,267, filed on Jul. 27, 2000.

(51) Int. Cl.[7] .............................. C23C 16/06; B05D 1/36
(52) U.S. Cl. ................ 427/250; 427/255.6; 427/255.7; 427/195; 427/203; 204/192.1; 205/109
(58) Field of Search ............................. 427/250, 372.2, 427/386, 388.1, 195, 203, 255.6, 255.7; 204/192.1; 205/109

(56) References Cited

U.S. PATENT DOCUMENTS

| | | | |
|---|---|---|---|
| 4,180,448 A | * 12/1979 | Soshiki et al. | 204/192 C |
| 4,242,413 A | * 12/1980 | Iwahashi et al. | 427/250 |
| 4,382,976 A | 5/1983 | Restall | |
| 4,407,871 A | * 10/1983 | Eisfeller | 427/250 |
| 4,535,024 A | * 8/1985 | Parker | 427/250 |
| 5,024,901 A | 6/1991 | Garg et al. | |
| 5,468,518 A | 11/1995 | Lein et al. | |
| 5,656,335 A | 8/1997 | Schwing et al. | |
| 5,773,154 A | 6/1998 | Takada | |
| 5,837,354 A | 11/1998 | Ogisu et al. | |
| 5,879,532 A | 3/1999 | Foster et al. | |
| 6,068,890 A | 5/2000 | Kaumle | |
| 6,156,379 A | * 12/2000 | Terada et al. | 427/214 |

OTHER PUBLICATIONS

Ferro Corporation, "Property Data Sheet VE–1129", product literature, 1998, 1 page, Cleveland, Ohio.
Ferro Corporation, "Property Data Sheet 153C121", product literature, 1 page, Cleveland, Ohio. No Date Available.

* cited by examiner

Primary Examiner—Bret Chen
(74) Attorney, Agent, or Firm—Anthony G. Eggnick

(57) ABSTRACT

A vacuum metalization process for applying a chrome coating on aluminum and steel substrates, for example vehicle wheels, hub caps, bumpers and the like. The process is environmentally compatible and produces a decorative, wear-resistant chrome finish and comprises four stages: a cleaning or preparation stage, a base coat application stage, a two-step PVD stage, and a topcoat application stage. The surface of the substrate is prepared and pretreated to provide a surface congenial for the adhesion of the base coat and to eliminate any contamination. An organic epoxy, thermosetting powder base coat is applied to smooth the surface to a glass-like finish and to ensure adhesion of the metal coatings. A two part metal coating is then applied via a PVD process, consisting of a Ni/Cr base and a Cr layer. A protective acrylic, thermosetting topcoat is then applied to protect the metal coating layers.

13 Claims, 2 Drawing Sheets

VACUUM METALIZATION PROCESS FOR CHROMING SUBSTRATES

This application claims the benefit of U.S. Provisional Application No. 60/221,267 filed on Jul. b 27, 2000.

BACKGROUND OF THE INVENTION

This invention relates generally to a process for providing a chrome finish onto substrates. Particularly, the invention relates to a process for vacuum metalizing chromium onto metal substrates. Specifically, this invention relates to a two step vacuum metalization process for chroming aluminum and steel substrates for automotive parts, for example, for providing a chrome layer on automatic parts such as vehicle wheels, hub caps, bumpers, and the like.

The metalization process of the present invention has specific and sequential steps to produce chromed aluminum and steel automotive parts having superior chrome adhesion characteristics to prevent delaminations and having chemical and road hazard resistant qualities. Although the disclosure herein discusses the process of metalizing chromium in the production of vehicle wheels, other chroming processes as well as the chroming of other metal substrates are within the purview of this invention.

In the past, aluminum and steel vehicle wheels, for example, have traditionally been electroplated to produce chrome wheels. These prior art processes require the wheel rim to be polished to provide a very smooth surface for the chrome plating to be effective. Further, the wheels are pretreated in hazardous chemicals to provide a clean and homogeneous surface for adherence of the chrome plating. The wheels are then coated with up to three different metal coatings with each step requiring the wheel to be submerged in hazardous solutions. The failure rate of these prior art processes is generally high. Additionally, should the chrome plated surface be damaged, corrosion or rust will typically begin rapidly, causing the chrome plating to delaminate from the wheel surface.

Another alternative prior art process has been developed which applies the chrome coating by vacuum metalization, thereby eliminating the application of the decorative coating using hazardous solutions. This prior art process entails applying one or two primer coat compositions to provide a smooth surface and to provide a suitable adhesion for the Cr to be applied. The wheel is then placed into a vacuum metalization chamber where a decorative coating is applied. Subsequently, a coating is applied to protect the metalized layer from environmental elements. The process produces chrome-like finishes on wheels, but not equal to the quality of the plating process and as such has not been accepted by the wheel manufacturers in the United States.

The present invention has overcome the difficulties and the shortcomings of the prior art. An object of the present invention is to provide a true chrome finish on wheels and the like that will be resistant to harsh climatic conditions. A further objective is to eliminate hazardous materials used during the application process and to greatly reduce the potential for delamination should the coating be damaged, impacted or scratched, as has been a problem with the prior art. This process is also applicable to any substrate where a durable, decorative, chrome finish is desired on automotive parts, for example, on vehicle wheels, bumpers, hub caps, and the like. Particularly, the object of the invention is to provide a vacuum metalization process for chroming metal substrates, such as aluminum and steel substrates.

SUMMARY OF THE INVENTION

The present invention relates to a process for chroming aluminum and steel substrates. The process of the invention utilizes a vacuum metalizing process which, preferably, comprises four stages: a cleaning or preparation stage utilizing a number of steps, a base coat application stage, a two-step Physical Vapor Deposition (PVD) stage, and a top coat application stage. Each stage utilizes specific process steps and uses particular formulations under specific process step parameters.

An aluminum or steel substrate or object, for example a vehicle wheel, to receive a decorative chrome coating is first cleaned to eliminate contamination. The cleaning stage begins by smoothing the wheel to provide a uniform surface roughness. Next, a series of washes are performed to the wheel; if the wheel is aluminum in composition, an alkaline/deionized water solution wash, followed by a deionized (DI) water rinse, followed by a non-Chromate/DI water solution coating, and finished with another DI water rinse. If the wheel is of a steel composition, the non-Chromate/DI water solution coating is replaced by an Iron Phosphate/city water solution conversion coating followed by a city water rinse. In the cleaning step for either the aluminum or steel composition, the wheel is rinsed with a final DI water rinse. The wheel is then dried using high-pressure filtered air and is subsequently placed in an oven to be outgassed. Last, the wheel is allowed to cool down.

The base coat applied in the base coat application stage is preferably an organic, thermosetting powder or the like and provides a smooth surface for Nickel/Chromium adhesion, however, an inorganic compound may be utilized. Alternatively, the base coat may be comprised of an electroplated coating, or e-coating. The wheel and base coat are heated to permit the coating to melt and flow evenly across the surfaces of the wheel. The temperature is then increased so that the organic powder will crosslink and solidify. The wheel temperature is then reduced in preparation for the two-step PVD stage.

To begin the two-step PVD stage, the wheel is placed into a PVD chamber to receive the chrome coating layer. The PVD stage consists of two steps. Both steps take place in vacuum conditions and by a sputtering or similar process, for example. The first step comprises sputtering an approximately 80% Nickel (Ni) and 20% Chromium (Cr) base metal layer onto the base coat on the wheel. The second step comprises sputtering an approximately 99.9% pure Chromium layer onto the metal base layer. As known in the art, various PVD and CVD processes are known utilizing metallic targets in vacuum conditions. Any such known processes may be utilized to deposit the Nickel/Chromium and Chromium layers according to the teachings of the invention.

The protective top coat applied in the topcoat application stage is preferably a clear, organic, thermosetting powder, although an inorganic compound and means to produce a colored finish may also be utilized. Alternatively, the top coat may be comprised of an electroplated coating, or e-coating. The top coat is applied to the wheel to cover the Chromium layer and is subsequently heated to cause crosslinking and solidification. The wheel is then permitted to cool down.

The vacuum metalization process of the present invention permits a decorative, chrome coating to be applied to a metal object, for example an aluminum or steel wheel, in an environmentally compatible manner without the use of hazardous chemicals and which is resistant to harsh climatic conditions and delamination. These and other benefits of this invention will become clear from the following description by reference to the drawings.

DESCRIPTION OF THE PREFERRED EMBODIMENTS

The present invention relates to a process of chroming aluminum and steel substrates, and particularly to the vacuum metalization of chromium onto aluminum or steel substrates. The process of this invention provides a decorative and durable chrome finish for aluminum or steel objects, for example vehicle wheels, hub caps, bumpers, or the like which is conducted in an environmentally compatible manner.

Although it is within the purview of this invention to provide a vacuum metalization process for chroming aluminum and steel substrates to produce articles exhibiting strong adhesion qualities of the metalized chrome and useful for a variety of articles, the chroming of an aluminum or steel wheel for automotive use will be used herein to describe the process stages and steps of the invention.

Figure 1:
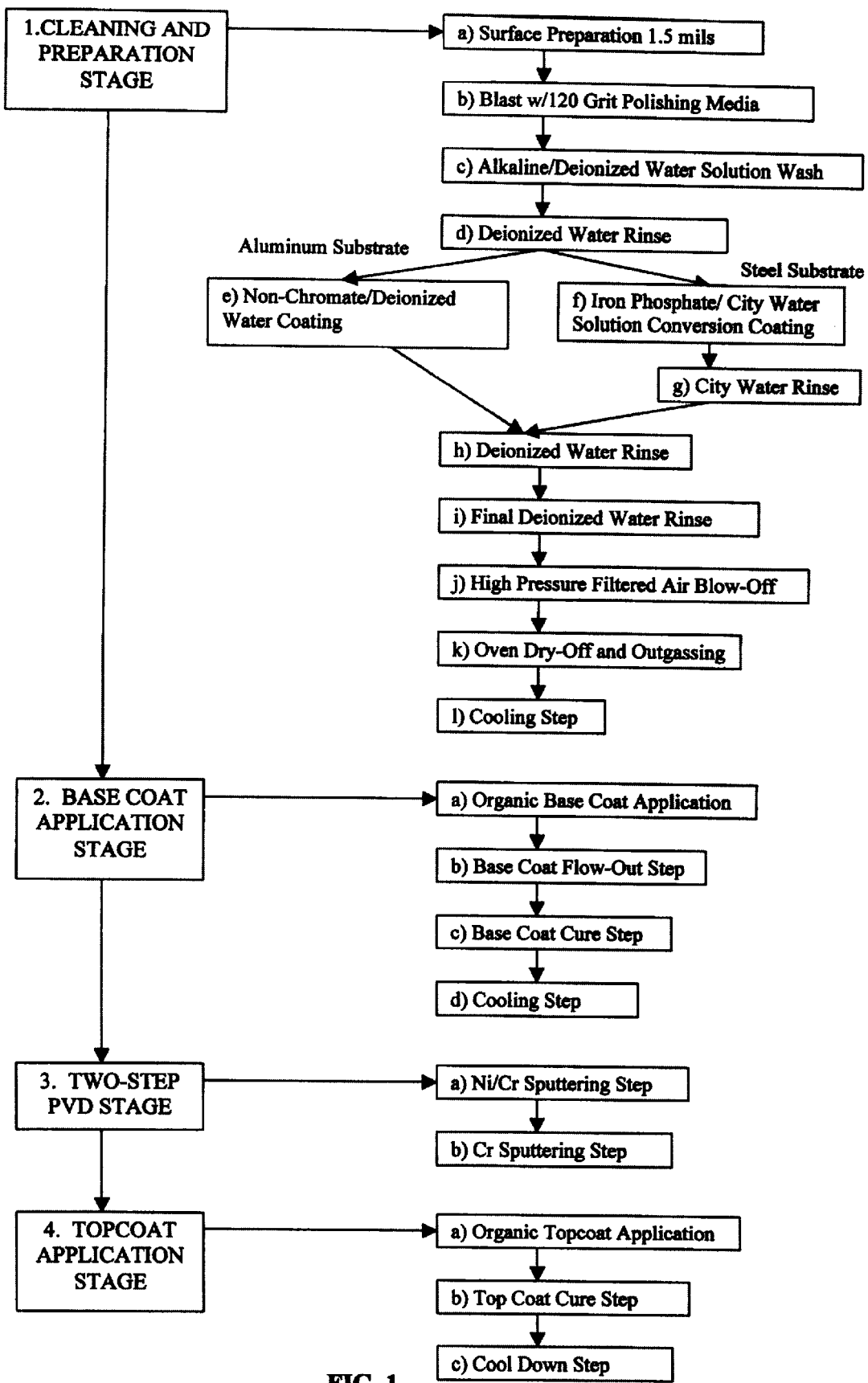
FIG. 1 is a flow diagram showing the steps of the process of the present invention.

Referring to FIG. 1, the four steps comprising the process of the present invention are set forth. The four general steps of the process are as follows: 1) Cleaning or Preparation Stage, 2) Base Coat Application Stage, 3) Two-Step PVD Stage and 4) Top Coat Application Stage.

CLEANING AND PREPARATION STAGE

The Cleaning and Preparation Stage 1 as shown in the process flow diagram of FIG. 1 is comprised of process steps 1a–1l. The surface of the substrate is initially smoothed to a roughness not greater than approximately 1.5 mils by any industry accepted process (1a). In other words, the smoothness of the substrate surface preferably does not exceed approximately 1.5 mils, measuring from the valleys to the peaks on the substrate surface. The substrate, for example a wheel, is then placed into a high-pressure blast cabinet, where the surface is roughed evenly with a polishing type blast media with coarseness not greater than approximately a 120 grit (1b). This process step provides a substrate surface that is congenial for the adhesion of the base coat application.

The substrate or wheel is next put through a multi-step, spray washer type, pretreatment process, depending on whether the substrate is aluminum or steel, to ensure that all contamination has been removed from the substrate and to provide proper adhesion of the base coat (1c–1i). During the pretreatment process the wheel is held in the vertical position to ensure complete coverage and to prevent puddling in any recessed areas. The first step (1c) of the pretreatment is an approximately 60 second wash cycle of an approximately 3% to 6% solution, Alkaline and deionized water, is applied at a temperature of approximately 140° F. This cleaning step is to remove any contamination that may be present on the substrate surface. The next step (1d) is an approximately 30-second cycle of deionized water rinse, applied at ambient temperature. If the wheel is constructed of aluminum, the next step (1e) is an approximately 60 second cycle of an approximately 1% to 3% solution, non-Chromate conversion and deionized water coating, is applied at approximately 140° F., to insure proper adhesion of the base coat. If the wheel is constructed of steel, the next step (1f) is an approximately 180-second wash cycle of an approximately 3%–7% solution, Iron Phosphate and city water conversion coating, applied at approximately 140° F., to insure proper adhesion of the base coat, followed by a city water approximately 60-second rinse step (1g), applied at ambient temperature. The next step (1h) is an approximately 30 second cycle of deionized water rinse, applied at ambient temperature and the following step (1i) is a final approximately 30-second, separate deionized water rinse. The deionized water used in the rinse/wash steps preferably has a mineral content no greater than approximately 25 ppm to ensure that no contamination is present in any of the solutions or rinses.

Excess water is next blown off by filtered air before entering a dry-off oven (1j). The wheel is heated in the dry-off oven to a temperature of approximately 275° F. to 350° F. (1k). The latter step serves two purposes: it evaporates any moisture on the wheel left from the pretreatment process and it causes the pores in the aluminum or steel to outgas any contamination and/or trapped vapors. This step insures that the contamination and/or trapped vapors will not release during the heating steps required in the base and top coat application stages. The wheel then enters a cool down chamber where filtered air cools the wheels to an approximate temperature range of approximately 150° F. to 250° F. (1l), in preparation for the base coat application.

The wheel preferably exits the cool down chamber directly into a pressurized clean room, wherein the atmosphere consists of particulates not greater than approximately 10,000 ppm. Personnel working within the clean room should preferably be required to wear a clean room suite and dust mask to prevent introduction of additional airborne contamination from their clothes, body hair, and the like. The remaining steps are also carried out in this clean room environment and under these conditions to protect from airborne contamination. The cleaning and preparation stage steps set forth above are exemplary to provide a proper metal surface for the remaining stages of the process of the invention.

BASE COAT APPLICATION STAGE

The Base Coat Application Stage 2 is shown in FIG. 1 to be comprised of steps 2a–2d. The base coat preferably consists of a hybrid epoxy, thermosetting powder coating or the like. However, the base coat used in this step may be comprised of an organic or inorganic chemical composition. The base coating may also be comprised of an electroplated coating or e-coating. E-coatings are generally applied in liquid form via an electroplating process whereby the substrate is either submerged in a dip tank under specified electrically charged conditions or is sprayed with the liquid e-coating material and then heated for curing purposes.

Referring to FIG. 1, the wheel is coated in the horizontal face up position to ensure even and smooth coverage (2a). By applying the powder at the elevated temperature of approximately 150° F. to 250° F., the powder begins to melt on the wheel upon application. This process step accomplishes several advantages: it ensures that all areas are coated and that the pores of the aluminum or steel are still in an outgased stage, it enables a thinner coat to be applied, and it reduces the time to preheat the metal in the next step. The desired thickness of the base coat is approximately 1.5 to 5.0 mils. The wheel is next preheated to an approximate temperature range of 285° F. to 310° F. after which it remains in that temperature range for a period of approximately 8 to 12 minutes (2b). During this phase step the powder continues to melt and flow evenly across all wheel surfaces. Temperature fluctuations above the desired range will cause the flow-out process to stop, while fluctuations below can cause thermal shock and effect the smoothness of the surface. Variations in time, outside the parameters will typically result in an uneven, wavy or orange peal type finishes.

The wheel is next preheated to a temperature range of approximately 445° F. to 475° F., after which it remains at that temperature for a period of approximately 13 to 20 minutes (2c). During this step the powder crosslinks and solidifies. If the temperature or time is reduced, typically evidenced by a light, transparent brown appearance, the surface will experience some movement during the curing of the top coat stage and thereby cause cracking in the Cr coating. If the temperature or time exceeds the parameters as typically evidenced by a black, non-transparent appearance, the surface will become too brittle and may separate from the wheel during the top coat stage and/or reduce its ability to absorb impacts causing premature coating failure. A properly cured base coat has a dark, transparent brown appearance on completion of the base coat curing. The wheel is next cooled to a temperature range of approximately 100° F. to 250° F., in preparation for the metalization process (2d). By keeping the wheel at an elevated temperature, the metalization layers adhere better to the organic base coat, for example, and it provides a brighter (lighter color) to the Cr coating.

TWO-STEP PVD STAGE

The wheel is next placed into a Physical Vapor Deposition (PVD) chamber for metalization. The chamber is equipped with Ni/Cr targets and Cr targets. Sufficient targets are arranged so that one of each type target will cover 100% of the wheel as the wheel is rotated on its axes in the chamber, to ensure complete coverage. The pressure in the chamber is then reduced to a pressure of approximately 0.2 to 0.75 mTorr to evacuate any moisture, outgas chamber walls and wheel base coat, and to create a vacuum environment. Argon, of approximately 99.99% purity is then injected into the chamber to bring the pressure up to approximately 2.5 to 3.5 mTorr, in order to create a plasma environment. At this step (3a), a base metal layer consisting of approximately 50% to 80% Ni and approximately 50% to 20% Cr is applied by sputtering for approximately 10 to 20 seconds at approximately 700 volt, 17 amps and 12 kW. These process step parameters are exemplary and vary depending upon the type of PVD machine and power supply utilized in the PVD machine. For example, changes in the power supply would change the time and voltage required. A lower content of Ni and a higher content of Cr in a target will produce a lighter color on the second (Cr) metalization layer. The base metal coating of this invention step provides a stable base for the Cr to be applied over. Samples without the Ni/Cr base developed cracks in the final step of heating the wheel to cure the top coat.

The pressure in the chamber is then reduced to a pressure of approximately 1.5 to 3.5 mTorr, in preparation for applying the Cr metal coating. Cr of approximately 99.99% purity is then applied by sputtering for approximately 5 to 10 seconds at approximately 620 volts, 19 amps and 12 kW (step 3b). These process steps are exemplary depending upon PVD machine type, power supply, size of targets and chamber pressure, etc. During the Ni/Cr application the Cr target will be charged in a range of approximately 0.25 kW to 0.3 kW, and during the Cr application the Ni/Cr target is charged in a range of approximately 0.04 kW to 0.05 kW to prevent contamination from each other. The desired thickness of the combined two metal layers is about 350 Å to 600 Å. On completion of the base and top coat the chamber is vented back to atmospheric pressure using compressed air that is heated, dried and filtered. Using the processed air to vent the chamber prevents contamination of the chamber's interior. The wheel is then removed from the vacuum chamber for application of the protective, clear organic top coat, for example. The two-step PVD stage set forth herein is exemplary and the NiCr and Cr layers may be deposited onto the prepared substrate surface in any known manner including for example, by Arc, CVD or similar methods of vacuum metalization. The important aspect of this stage being the use of the sequential NiCr and Cr layers onto the prepared substrate surface.

As known in the art, various PVD and CVD processes are known utilizing metallic targets in vacuum conditions and employing magnetrons to produce magnetic fields for concentrating the deposit of the metal ions to the object. For example, a planar magnetron configuration has been found suitable in the two-step PVD process of the present invention. Thus, a planar magnetron sputtering source or one having a flat or planar shaped target has been found suitable in accordance with the process of this invention. However, other vacuum metalization processes may also be utilized in the chroming of aluminum and steel substrates process of this invention.

TOPCOAT APPLICATION STAGE

The Topcoat Application Stage 4 as shown in FIG. 1 comprises steps 4a–4c. The clear organic top coat application preferably consists of an acrylic, thermosetting powder coating or the like. The purpose of the topcoat is to provide protection to the metal coatings, wear resistance and UV protection. The topcoat may have an organic or inorganic chemical composition. The top coating may also be comprised of an electroplated coating or e-coating. The e-coating provides a scratch resistant top coat for the chrome layer applied in the two-step PVD process of the invention. E-coatings are generally applied in liquid form via an electroplating process whereby the chromed substrate is either submerged in a dip tank under specified electrically charged conditions or is sprayed with the liquid e-coating material and then heated for curing purposes.

The wheel is coated in the horizontal face up position to ensure even and smooth coverage (4a). The desired thickness of the coating is in a range of approximately 2.0 to 3.0 mils. The clear top coat is applied at a temperature range between approximately 80° F. to 200° F. Temperatures exceeding these parameters will cause the Cr layer to darken. After application of the clear top coat, the wheel is preheated to an approximate temperature range of 320° F. to 360° F., after which it will remain at that temperature for a period of approximately 15 to 20 minutes (4b). During this method step, the powder will crosslink and solidify. The wheel then enters a cool down chamber where filtered air cools the wheels to ambient temperature (4c).

Figure 2:
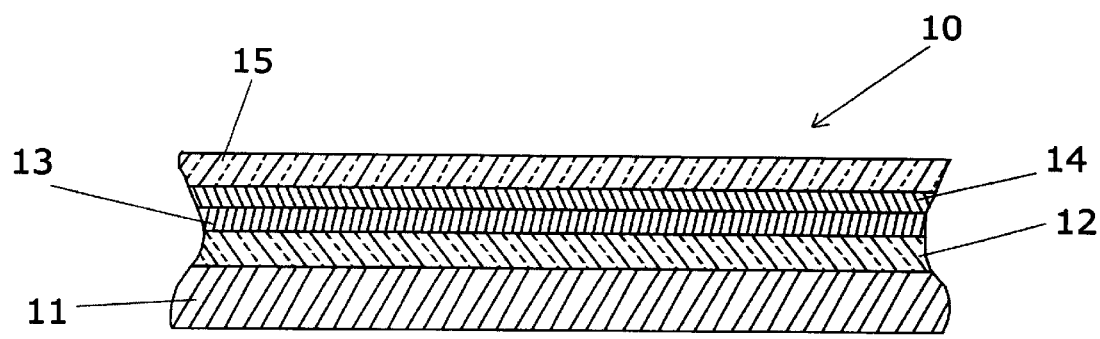
FIG. 2 is a cross-sectional view of a substrate showing the layers formed thereon from the process of the present invention.

FIG. 2 shows a cross-section of the layers formed on the chromed substrate 10 as a result of the process steps of the present invention. The wheel or substrate 11 is shown to have a base coat layer 12, a Ni/Cr metal layer 13, a Cr layer 14, and a top coat layer 15. The base coat 12 is preferably a hybrid epoxy, thermosetting powder or the like. The Ni/Cr layer 13 and the Cr layer 14 are formed in the two-step PVD process and are, together, preferably approximately 350Å to 600 Å in thickness. The top coat is preferably an acrylic, thermosetting powder coating or the like, however, organic or inorganic top coat compositions may be utilized as previously discussed.

The discussion above regarding the base coat application stage and the top coat application stage, particularly with respect to FIG. 1, relates respectively to the application of a hybrid epoxy, thermosetting powder coating for the base coat and the application of an acrylic thermosetting powder coat for the top coat. The application of these base coat and top coat formulations require specific process parameters, i.e., temperatures, times, etc., as set forth in FIG. 1. As also discussed herein, other base coat and top coat formulations may also be used in the metalization process of the invention. The application parameters of these base coat and top coat formulations would be different from those discussed with respect to FIG. 1 and are generally set by the manufacturers of the coating formulations.

Although a clear top coat has been discussed in the process of the invention, various colored tints may also be utilized on the chromed layer produced in this invention. For example, the top coat itself may be tinted with a color, or a color may be provided to the object itself during the PVD process. For example, the introduction of a gas such as Argon, Nitrogen, or the like in the PVD process, as known in the art, will produce a specified color to the object.

A wheel coated using the process of the present invention produced the following test results:

| | | |
|---|---|---|
| 1) Salt Spray Test | (ASTM B-117) | 480+ Hours |
| 2) Adhesion | (ASTM D-3359) | 100% |
| 3) Pencil Hardness | (ASTM D-3363) | H–2H |
| 4) Thermal Cycle | (GM 264M) | Passed |

In summary, the process of the present invention provides a Preparation Stage 1, a Base Coat Application Stage 2, a Two-Step PVD Stage 3, and a Top Coat Application Stage 4. The process produces a chrome coating on a surface, preferably aluminum or steel, of an object, such as vehicle wheels, hub caps, bumpers and the like, on which it is desirable to have a decorative chrome finish. The process of this invention is conducted without the use of hazardous chemicals, making it environmentally friendly, and produces a chrome finish which is resistant to the elements and has a reduced potential for delamination.

As many changes are possible to the embodiments of the processes of this invention utilizing the teachings thereof, the descriptions above, and the accompanying drawing should be interpreted in the illustrative and not in the limited sense.

That which is claimed is:

1. A process of coating a substrate with a uniform and stable chrome finish, said process comprising in the sequence set forth:
   a) providing a substrate;
   b) applying a first stabilizing metallic layer to said substrate by means of a vacuum vapor deposition, said first metallic layer comprising a mixture of approximately 50–80% Nickel and 50–20% Chromium; and
   c) applying a second metallic layer over said first metallic layer via a vacuum vapor deposition method, said second metallic layer being comprised of approximately 99% Chromium.

2. The process of claim 1, further comprising the step of preparing a surface of said substrate prior to applying said stabilizing metallic layer.

3. The process of claim 1, further comprising the step of applying a base coat before applying said stabilizing metallic layer.

4. The process of claim 1, further comprising the step of applying a top protective layer after said second metallic layer, wherein said top protective layer is an acrylic thermosetting powder and wherein said top protective layer is cured at an approximate temperature range of 320–360° F.

5. The process of claim 1, wherein the combined thickness of the first metallic layer and the second metallic layer is approximately 350–600Å.

6. The process of claim wherein said substrate is a metal.

7. The process of claim 6, wherein said metal is aluminum or steel.

8. A process for chroming an aluminum or steel substrate, said process comprising:
   a) providing an aluminum or steel substrate;
   b) cleaning and preparing a surface of said substrate, said cleaning and preparing comprising at least one rinsing step and at least one outgassing step;
   c) applying and curing a base coat over said cleaned and prepared substrate surface;
   d) applying a Nickel/Chromium metallic layer via a sputtering process, said applied layer comprising approximately 50–80% Nickel and 50–20% Chromium;
   e) applying a Chromium metallic layer via a sputtering process over said Nickel/Chromium layer, said applied Chromium layer comprising approximately 99.99% Chromium; and
   f) applying and curing a topcoat over said Chromium layer.

9. The process of claim 8, wherein said applied base coat is comprised of an organic, epoxy, thermosetting powder which is cured at an approximate temperature range of 445–475° F. and wherein said applied topcoat is an organic, acrylic, thermosetting powder which is cured at an approximate temperature range of 320–360° F.

10. The process of claim 8, wherein said substrate provided is comprised of aluminum and wherein said cleaning and preparation step further comprises applying a non-chromate and deionized water coating.

11. The process of claim 8, wherein said base coat and said top coat applied is comprised of an electroplated coating.

12. The process of claim 8, wherein said substrate provided is comprised of steel.

13. The process of claim 12, wherein said cleaning and preparation step further comprises applying an Iron Phosphate and city water solution conversion coating followed by applying a city water rinse.

\* \* \* \* \*

UNITED STATES PATENT AND TRADEMARK OFFICE
CERTIFICATE OF CORRECTION

PATENT NO.   : 6,399,152 B1
DATED        : June 4, 2002
INVENTOR(S)  : Gary D. Goodrich It is certified that error appears in the above-identified patent and that said Letters Patent is hereby corrected as shown below:

<u>Column 8,</u>
Line 13, insert the number -- 1 -- after the word "claim".

Signed and Sealed this

Twenty-third Day of March, 2004

JON W. DUDAS
*Acting Director of the United States Patent and Trademark Office*